United States Patent
Lee

(10) Patent No.: US 9,182,073 B2
(45) Date of Patent: Nov. 10, 2015

(54) BRACKET AND FRAME BODY HAVING THE SAME

(71) Applicant: AU Optronics Corporation, Hsin-Chu (TW)

(72) Inventor: Ping Lee, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 47 days.

(21) Appl. No.: 13/735,105

(22) Filed: Jan. 7, 2013

(65) Prior Publication Data

US 2014/0061405 A1 Mar. 6, 2014

(30) Foreign Application Priority Data

Sep. 4, 2012 (TW) .............................. 101132173 A

(51) Int. Cl.
*F21V 35/00* (2006.01)
*F16M 13/02* (2006.01)
*H04N 5/64* (2006.01)

(52) U.S. Cl.
CPC *F16M 13/02* (2013.01); *H04N 5/64* (2013.01)

(58) Field of Classification Search
CPC .................................. F16M 13/02; H04N 5/64
USPC ............................... 248/200, 220.21; 361/796
See application file for complete search history.

(56) References Cited

U.S. PATENT DOCUMENTS

| 5,490,788 | A * | 2/1996 | Mazzochette .................. 439/83 |
| 6,378,604 | B1 * | 4/2002 | Feind et al. .................... 165/166 |
| 2009/0122473 | A1 | 5/2009 | Lee et al. |
| 2010/0155559 | A1 | 6/2010 | Liu |
| 2011/0255033 | A1 | 10/2011 | Huang et al. |
| 2013/0107429 | A1 | 5/2013 | Zhou |

FOREIGN PATENT DOCUMENTS

| CN | 102506394 | 6/2012 |
| TW | 201026049 | 7/2010 |

* cited by examiner

*Primary Examiner* — Joanne Silbermann
(74) *Attorney, Agent, or Firm* — WPAT, PC; Justin King

(57) ABSTRACT

A frame body includes a bottom plate, a connection portion, and a bracket. The bracket includes a first sidewall, a second sidewall, a bending portion, a positioning board, and a connection layer. The first sidewall has a first end connected to the connection portion and has a first surface facing away from the accommodating space. The second sidewall is adjacent to a side of the first sidewall that faces away from an accommodating space of the frame body. The second sidewall has a second surface facing the first surface. The bending portion is connected to a second end of the first sidewall that is distal to the connection portion and the second sidewall. The positioning board is connected to an end of the second sidewall that is distal to the bending portion. The connection layer adheres the first surface and the second surface.

8 Claims, 9 Drawing Sheets

BRACKET AND FRAME BODY HAVING THE SAME

RELATED APPLICATIONS

This application claims priority to Taiwan Application Serial Number 101132173, filed Sep. 4, 2012, which is herein incorporated by reference.

BACKGROUND

1. Technical Field

The present disclosure relates to a bracket and a frame body having the same.

2. Description of Related Art

In recent years, liquid crystal displays (LCDs) have been extensively used in various consumer electronic products and are gradually replacing cathode ray tubes (CRTs). The replacing of CRTs with LCDs is occurring due to the fact that LCDs have the advantages of high definition, small volume, low weight, low radiation, and low power consumption compared with CRTs. LCDs are used to display images in, for example, most televisions, monitors, cellular phones, and portable computers on the market. Therefore, LCDs have become indispensable electronic products for work or pleasure.

A liquid crystal display often includes an LC panel, a light guide plate, a reflective plate, and a bezel. The bezel needs to have sufficient strength to support the LC panel, the light guide plate, and the reflective plate, so that the bezel is often made of metal. Moreover, the bezel usually includes an outwardly bent ear portion which is used for assembly to a rear cover of a system provided by clients. For example, the bezel may be positioned on the rear cover of the system by screwing or otherwise coupling the ear portion thereto.

When the bezel is made of stainless steel, while it has a high degree of strength, it is, on the other hand, heavy, costly, and has low heat dissipation efficiency, such that the bezel does not easily satisfy the clients. In contrast, when the bezel is made of aluminum, while it is light, low in cost, and has good heat dissipation efficiency, such an aluminum bezel has a low strength. Therefore, the ear portion of the bezel made of aluminum may easily break when external forces are applied thereto, especially at a bending portion of the ear portion, making it difficult to fix the bezel firmly on the rear cover of a liquid crystal display.

SUMMARY

An aspect of the present invention is to provide a bracket.

In an embodiment of the present invention, a bracket includes a first sidewall, a second sidewall, a bending portion, a positioning board, and a connection layer. The first sidewall has a first surface. The second sidewall has a second surface that faces the first surface of the first sidewall. The bending portion is connected to the first and second sidewalls. The positioning board is connected to an end of the second sidewall that is distal to the bending portion. The connection layer adheres the first surface of the first sidewall and the second surface of the second sidewall.

In one or more embodiments of the present invention, the connection layer is a two-component epoxy adhesive capable of being cured at a room temperature, epoxy glue, or ultraviolet curing glue.

In one or more embodiments of the present invention, the connection layer is a room temperature curing two component epoxy adhesive, epoxy glue, or ultraviolet curing glue.

In one or more embodiments of the present invention, the connection layer is solder.

In one or more embodiments of the present invention, a portion of the bracket where the second sidewall and the positioning board are connected is formed an arc surface.

Another aspect of the present invention is to provide a frame body having an accommodating space.

In an embodiment of the present invention, a frame body includes a bottom plate, a connection portion standing erect on the bottom plate, and a bracket. The bracket includes a first sidewall, a second sidewall, a bending portion, a positioning board, and a connection layer. The first sidewall has a first end connected to the connection portion and has a first surface facing away from the accommodating space. The second sidewall is adjacent to a side of the first sidewall that faces away from the accommodating space. The second sidewall has a second surface facing the first surface of the first sidewall. The bending portion is connected to a second end of the first sidewall that is distal to the connection portion and the second sidewall. The positioning board is connected to an end of the second sidewall that is distal to the bending portion. The connection layer adheres the first surface of the first sidewall and the second surface of the second sidewall.

In one or more embodiments of the present invention, the first sidewall of the bracket is perpendicular to the bottom plate.

In one or more embodiments of the present invention, the first sidewall of the bracket is parallel to the bottom plate.

In one or more embodiments of the present invention, the first and second sidewalls are made of metal, and the connection layer is a metal adhesive.

In one or more embodiments of the present invention, a portion of the bracket where the second sidewall and the positioning board are connected is formed as an arc surface.

In one or more embodiments of the present invention, a portion of the frame body where the connection portion and the first sidewall of the bracket are connected is formed as an arc surface.

In the aforementioned embodiments of the present invention, since the bracket includes the connection layer to adhere the first and second sidewalls, the strength of the bracket can be increased, such that the bracket is not easily broken when external forces are applied to the bracket. Furthermore, since the connection layer can improve the strength of the bracket, a material that is light, low cost, and that has good heat dissipation efficiency can be used to manufacture the bracket. Stated differently, since the strength of the bracket is increased through use of the connection layer, heavy, costly, and low heat dissipation efficiency materials may be avoided when manufacturing the bracket. As a result, materials with specific physical properties may be chosen more flexibly for use in manufacturing the bracket.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
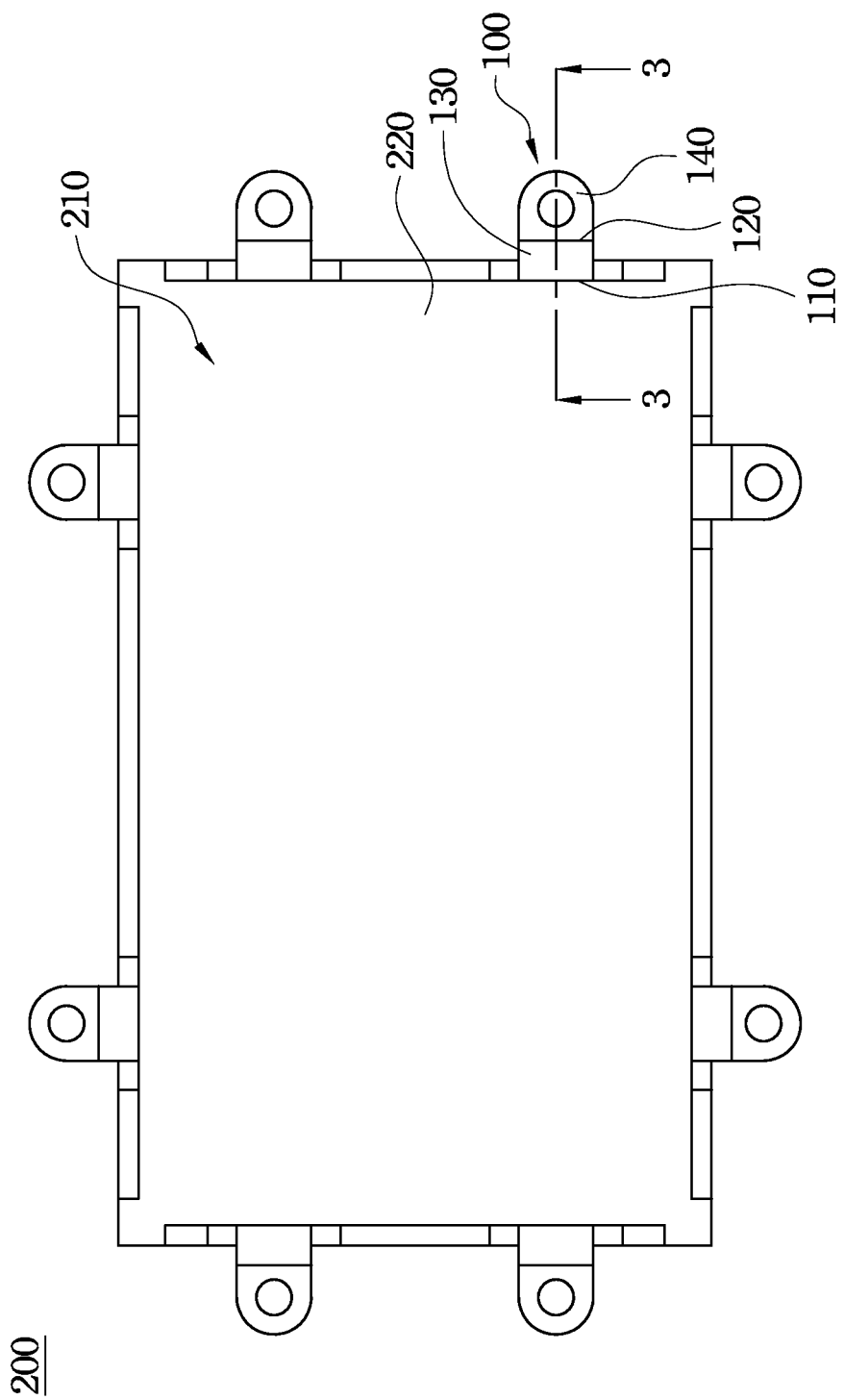
FIG. 1 is a top view of a frame body according to an embodiment of the present invention.
Figure 2:
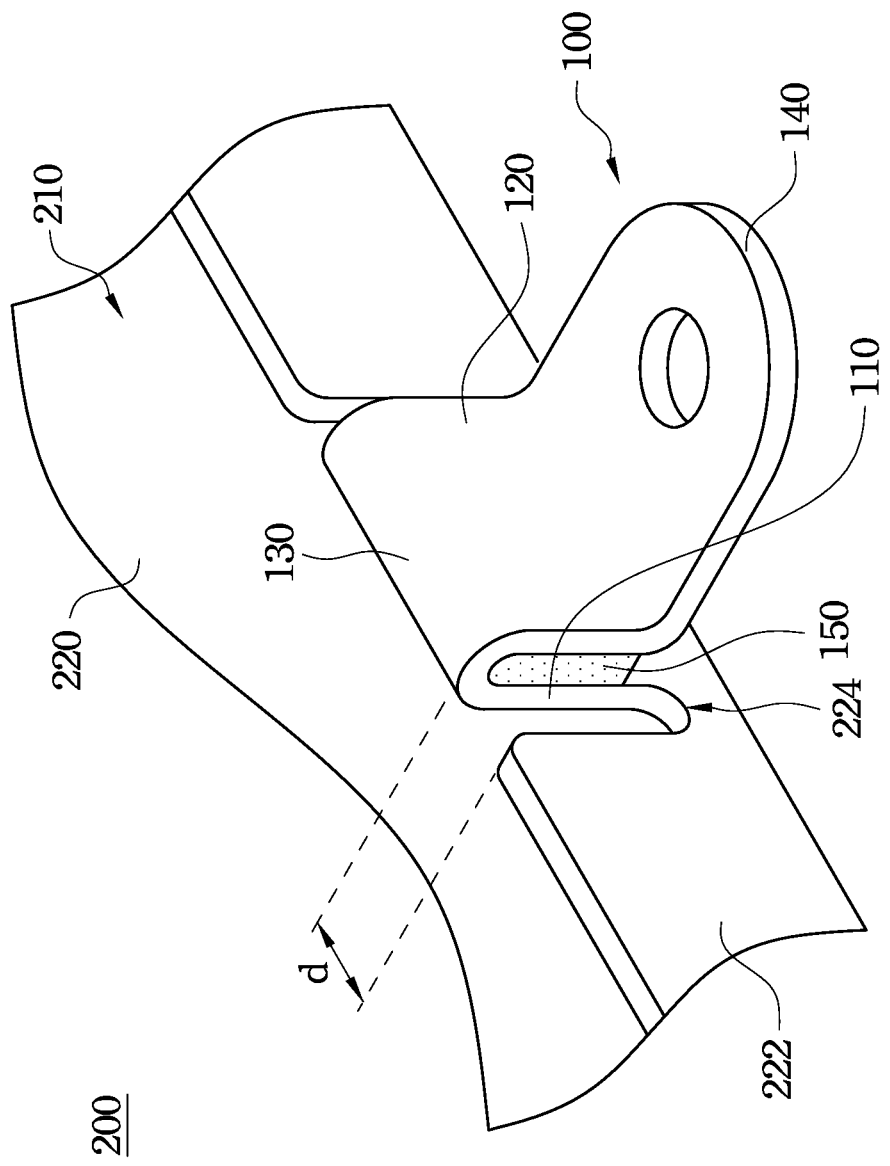
FIG. 2 is a partial perspective view of the frame body shown in FIG. 1.

FIG. 1 is a top view of a frame body 200 according to an embodiment of the present invention. FIG. 2 is a partial perspective view of the frame body 200 shown in FIG. 1. As shown in FIG. 1 and FIG. 2, the frame body 200 includes a bottom plate 220 and a bracket 100, and the bracket 100 is connected to an edge of the bottom plate 220. The frame body 200 can be assembled to a display module. That is, the frame body 200 can be positioned on a rear cover of the display module by screwing or otherwise coupling the bracket 100 thereto (to be described hereinafter).

The frame body 200 has an accommodating space 210 to receive and support a display panel, a light guide plate, a reflective plate, an optical sheet, etc. The frame body 200 further includes a frame sidewall 222 that stands erect on the bottom plate 220. Portions of the frame sidewall 222 adjacent to two sides of the bracket 100 may be abutted against or separated from the bracket 100. In this embodiment, a gap d is formed between the bracket 100 and the frame sidewalls 222, and a bottom portion 224 under the gap d is circular arc shaped. As a result, when external forces are applied to the bracket 100, the gap d can function as a stress relief cavity and thereby prevent the bracket 100 from breaking.

In the following description, structures of the frame body 200 and the bracket 100 will be described in detail.

Figure 3:
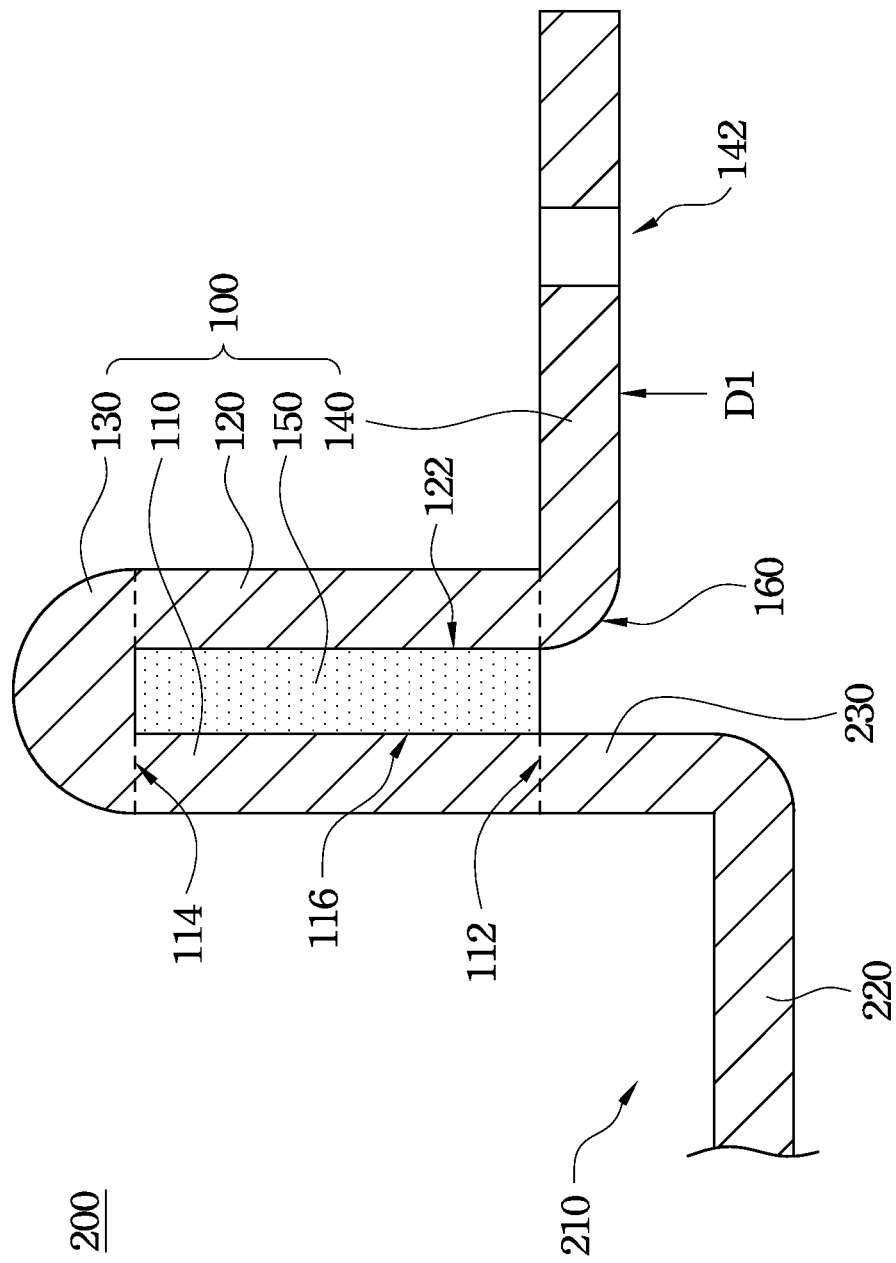
FIG. 3 is a cross-sectional view taken along line 3-3 shown in FIG. 1.

FIG. 3 is a cross-sectional view taken along line 3-3 shown in FIG. 1. As shown in FIG. 2 and FIG. 3, the frame body 200 includes the bottom plate 220, a connection portion 230, and the bracket 100. The connection portion 230 stands erect on the bottom plate 220. The bracket 100 includes a first sidewall 110, a second sidewall 120, a bending portion 130, a positioning board 140, and a connection layer 150. The first sidewall 110 has a first end 112 and a second end 114. The first end 112 of the first sidewall 110 is connected to the connection portion 230, and the first sidewall 110 has a first surface 116 facing away from the accommodating space 210. The second sidewall 120 is adjacent to a side of the first sidewall 110 that faces away from the accommodating space 210, and the second sidewall 120 has a second surface 122 facing the first surface 116 of the first sidewall 110. The bending portion 130 is connected to the second end 114 of the first sidewall 110 and the second sidewall 120. The second end 114 of the first sidewall 110 is distal to the connection portion 230.

Furthermore, the positioning board 140 is connected to an end of the second sidewall 120 that is distal to the bending portion 130. The connection layer 150 is adhered to the first surface 116 of the first sidewall 110 and the second surface 122 of the second sidewall 120. The positioning board 140 has a through hole 142, such that a fixing element (e.g., a screw or a bolt) can penetrate the through hole 142 to fix the positioning board 140 on a housing.

In this embodiment, the first sidewall 110 of the bracket 100 is perpendicular to the bottom plate 220. However, the first sidewall 110 need not be exactly perpendicular to the bottom plate 220 and there may be a 10% perpendicularity tolerance, but the present invention is not limited in this regard. The first sidewall 110 of the bracket 100 may extend from the connection portion 230 of the frame body 200 in such a manner that the first sidewall 110 and the connection portion 230 are coplanar. The frame body 200 can be manufactured by stamping, such that the bottom plate 220, the connection portion 230, and the first and second sidewalls 110, 120, the bending portion 130, and the positioning board 140 of the bracket 100 can be formed as a single piece. However, the frame body 200 may also be manufactured by other methods, and the present invention is not limited in this regard.

The bracket 100 includes the connection layer 150 to adhere the first and second sidewalls 110, 120, such that the strength of the bracket 100 can be increased. For example, when an external force in a direction D1 is applied to the positioning board 140 of the bracket 100, since the first and second sidewalls 110, 120 are adhered by the connection layer 150, the first and second sidewalls 110, 120 do not easily separate, and the bending portion 130 is not easily broken by the external force. Moreover, since the connection layer 150 can improve the strength of the bracket 100, materials with specific physical properties may be chosen for use in manufacturing the bracket 100. For example, a material that is light, low in cost, and that has good heat dissipation efficiency can be used to manufacture the bracket 100. Stated differently, since the strength of the bracket 100 is increased through use of the connection layer, heavy, costly, and low heat dissipation efficiency materials may be avoided when manufacturing the bracket 100. That is to say, when manufacturing the bracket 100, designers can more flexibly choose materials with specific physical properties in accordance with practical requirements.

In this embodiment, the first and second sidewalls 110, 120 may be made of metal. For example, the first and second sidewalls 110, 120, the bending portion 130, and the positioning board 140 may be an integral aluminum member, or the bottom plate 220, the connection portion 230, and the first and second sidewalls 110, 120, the bending portion 130, and the positioning board 140 of the bracket 100 may be an integral aluminum member. Compared with stainless steel, aluminum has the advantages of being light and low in cost, but has a lower strength than stainless steel. However, the connection layer 150 can improve the strength of the bracket 100, such that the bracket 100 is not easily broken by external forces. The connection layer 150 may be a metal adhesive, such as a two-component epoxy adhesive (AB glue) capable of being cured at a room temperature, ultraviolet curing glue (UV glue), epoxy glue, or solder, but the present invention is not limited in this regard.

Moreover, the portion of the bracket 100 where the second sidewall 120 and the positioning board 140 of the bracket 100 are connected can be designed as an arc surface 160. When the connection layer 150 is filled between the first and second sidewalls 110, 120, the connection layer 150 can flow into a location between the first and second sidewalls 110, 120 by gravity or through use of capillary action, and the connection layer 150 does not easily overflow.

Figure 4:
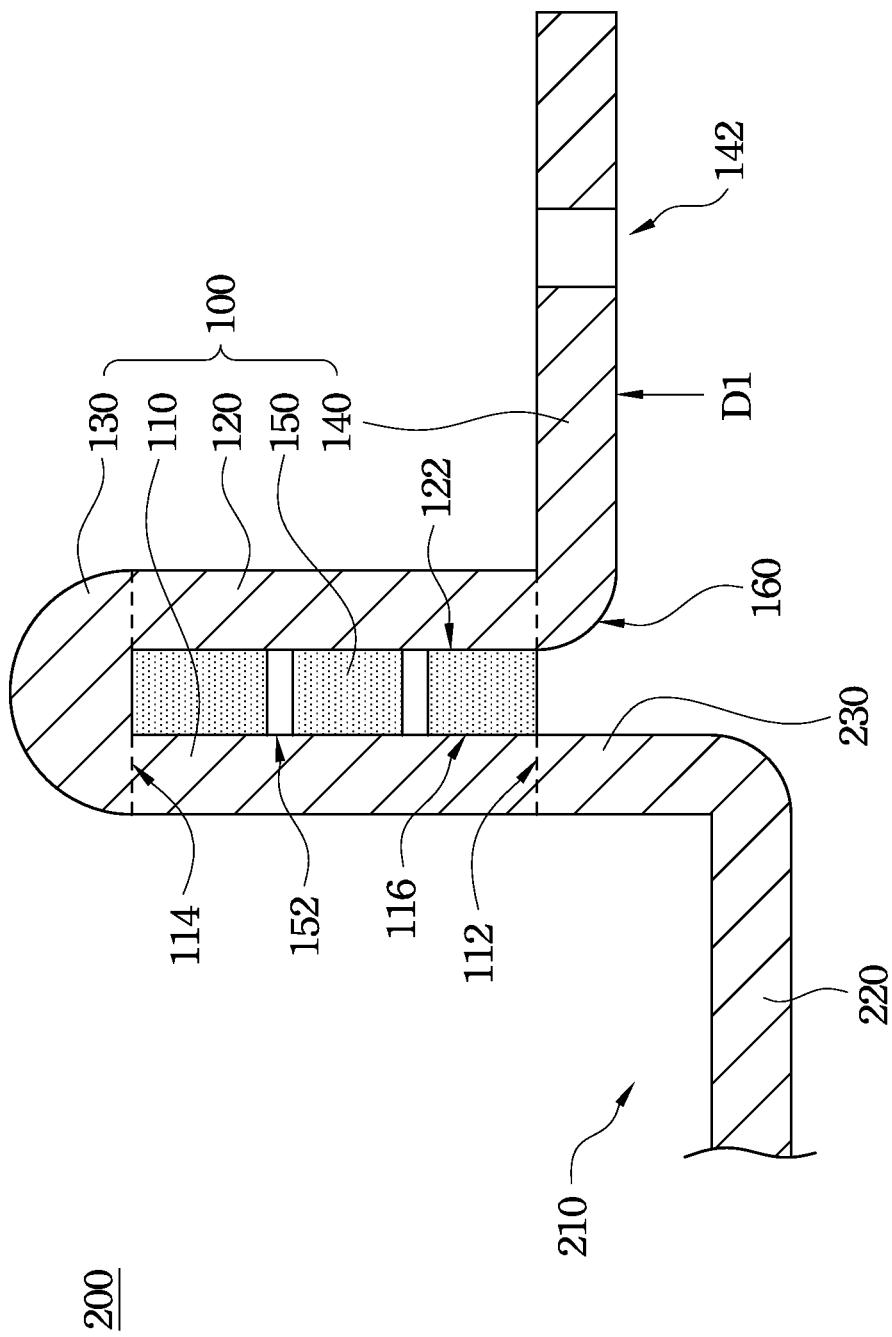
FIG. 4 is a cross-sectional view of a frame body according to an embodiment of the present invention, in which the cross-sectional position is the same as in FIG. 3.

FIG. 4 is a cross-sectional view of a frame body 200 according to an embodiment of the present invention, in which the cross-sectional position is the same as in FIG. 3.

The frame body 200 includes the bottom plate 220, the connection portion 230, and the bracket 100. The bracket 100 includes the first and second sidewalls 110, 120, the bending portion 130, the positioning board 140, and the connection layer 150. The difference between this embodiment and the embodiment shown in FIG. 3 is that the connection layer 150 is formed by spot welding of the first and second sidewalls 110, 120. Therefore, the connection layer 150 does not need to include an adhesive or solder. In this embodiment, a gap 152 formed by providing spot welds is between the first surface 116 of the first sidewall 110 and the second surface 122 of the second sidewall 120.

Figure 5:
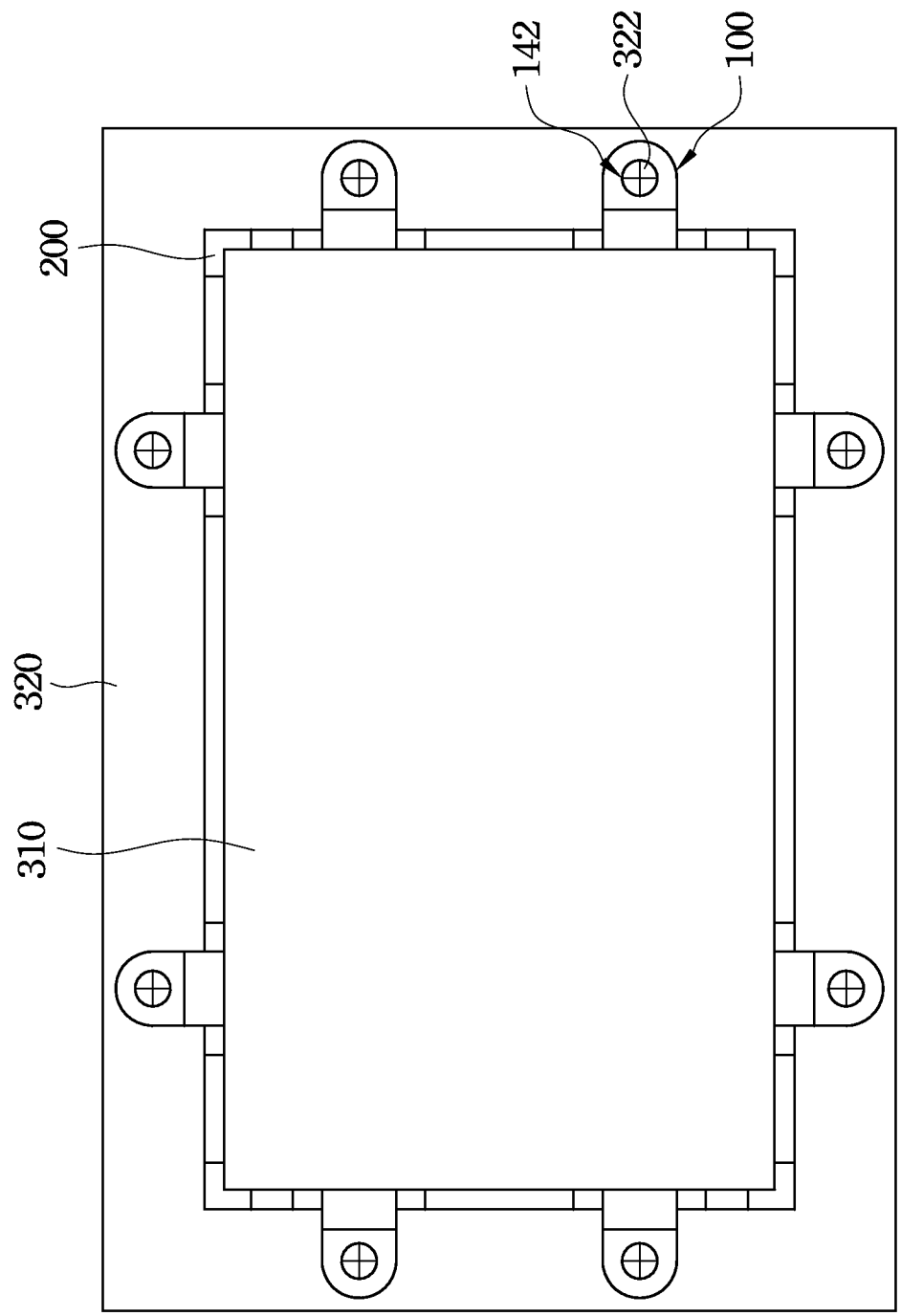
FIG. 5 is a top view of the frame body shown in FIG. 1 assembled to a display module.

FIG. 5 is a top view of the frame body 200 shown in FIG. 1 assembled to a display module 300. As shown in FIG. 1 and FIG. 5, the display module 300 includes a display panel 310, a rear cover 320, and a cover screw 322. The display panel 310 is arranged in the accommodating space 210 of the frame body 200. The cover screw 322 penetrates the through hole 142 of the bracket 100 and is fixed to the rear cover 320. As a result, the frame body 200 can be fixed on the rear cover 320 of the display module 300 by the bracket 100. In this embodiment, the through hole 142 is a hole having no thread, but the present invention is not limited in this regard. The cover screw 322 may be replaced by a bolt, and it is necessary only that an element that can be fixed on the rear cover 320 of the display module 300 be used.

It is to be noted that a description of the connection relationship and materials of the aforementioned elements will not be repeated. In the following description, other types of the frame body 200 will be described.

Figure 6:
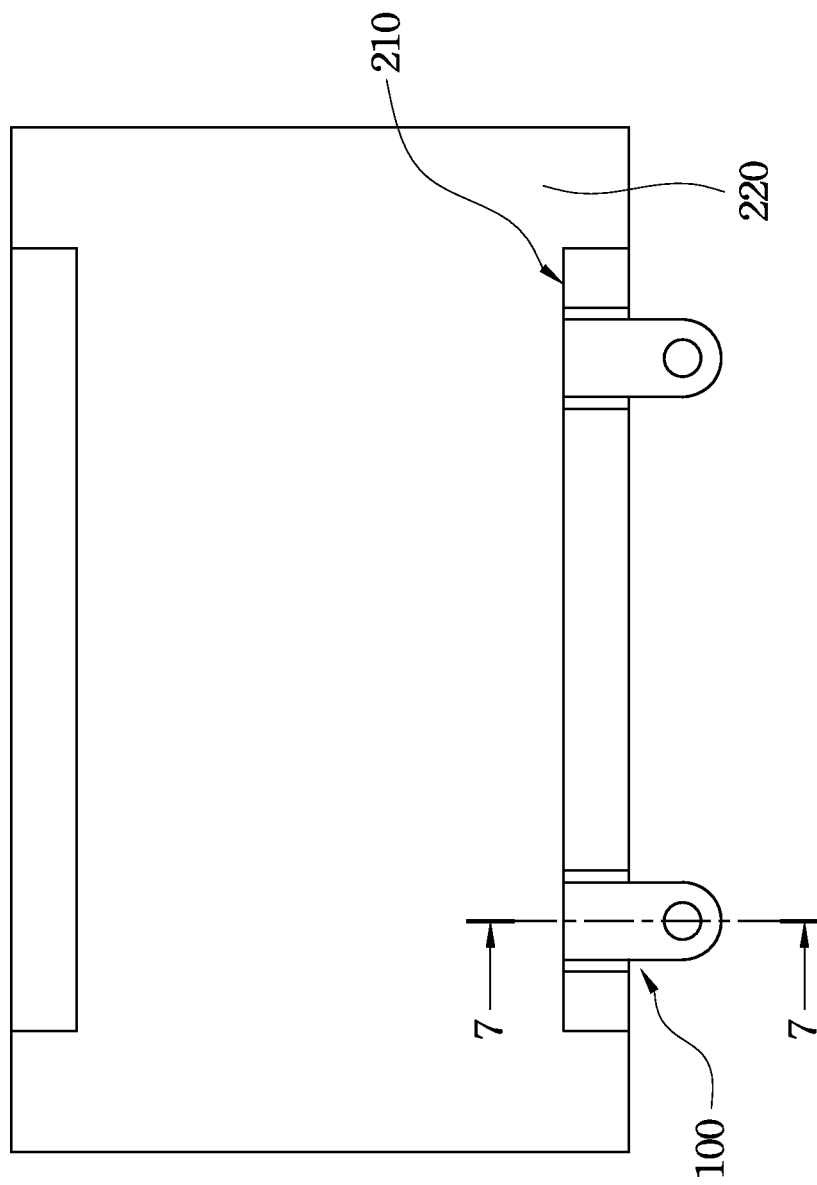
FIG. 6 is a top view of a frame body according to an embodiment of the present invention.
Figure 7:
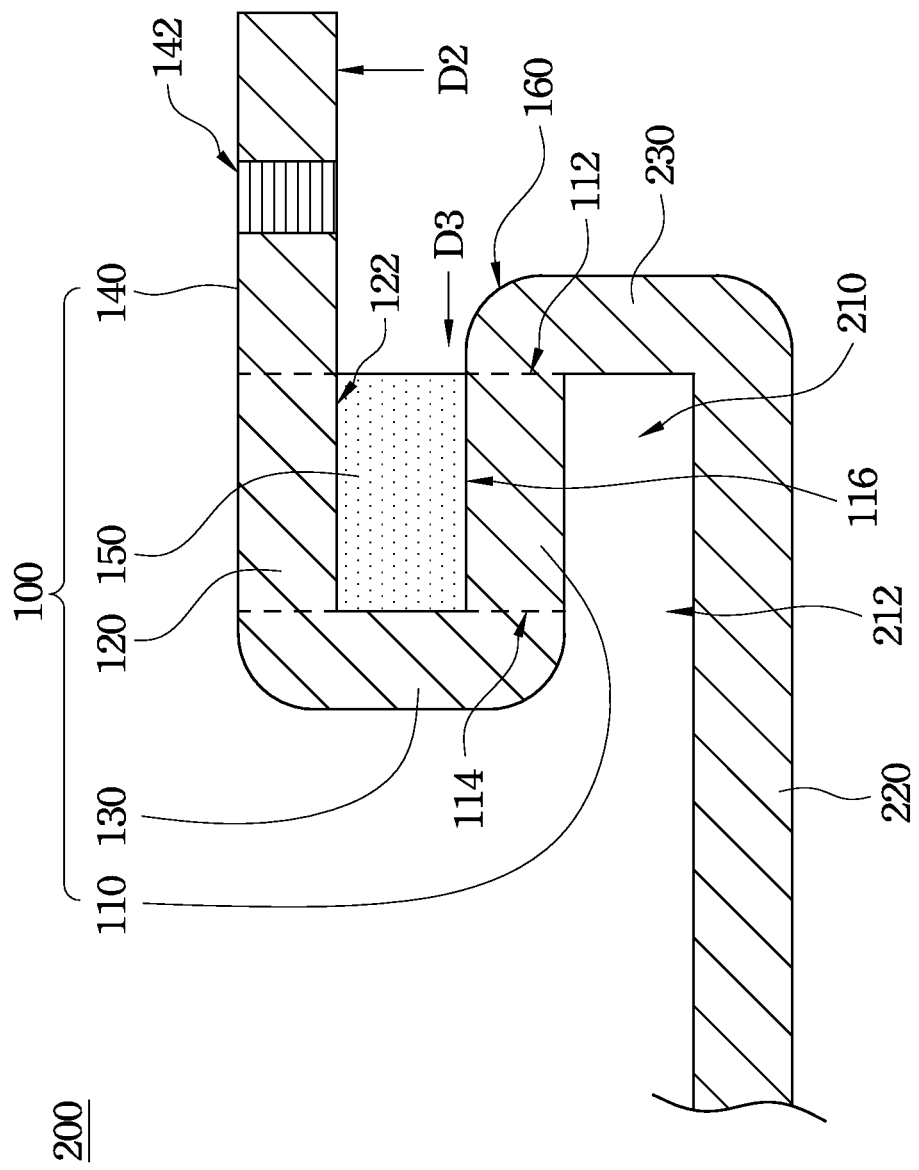
FIG. 7 is a cross-sectional view taken along line 7-7 shown in FIG. 6.

FIG. 6 is a top view of a frame body 200 according to an embodiment of the present invention. FIG. 7 is a cross-sectional view taken along line 7-7 shown in FIG. 6. As shown in FIG. 6 and FIG. 7, the frame body 200 includes the bottom plate 220 and the bracket 100. In use, the frame body 200 can be assembled to a display module, and a printed circuit board can be positioned on the frame body 200 by screwing or coupling the bracket 100 thereto (to be described hereinafter). The frame body 200 includes the bottom plate 220, the connection portion 230, and the bracket 100, and the bracket 100 includes the first and second sidewalls 110, 120, the bending portion 130, the positioning board 140, and the connection layer 150.

The connection portion 230 stands erect on the bottom plate 220. The differences between this embodiment and the embodiment shown in FIG. 3 are that the first sidewall 110 of the bracket 100 is parallel to the bottom plate 220, and the portion of the frame body 200 where the connection portion 230 and the first sidewall 110 of the bracket 100 are connected is formed as an arc surface 160. It is noted that the first sidewall 110 need not be exactly parallel to the bottom plate 220 and there may be a 10% perpendicularity tolerance, but the present invention is not limited in this regard.

In this embodiment, the first sidewall 110 of the bracket 100 is perpendicular to the connection portion 230. The accommodating space 210 is formed by the first sidewall 110, the connection portion 230, and the bottom plate 220, and the accommodating space 210 is used to accommodate a light guide plate for example. As in the case of the above embodiments, since the bracket 100 includes the connection layer 150 to adhere the first and second sidewalls 110, 120, the strength of the bracket 100 can be increased. For example, when an external force in a direction D2 is applied to the positioning board 140 of the bracket 100, the bending portion 130 is not easily broken by the external force. Furthermore, when the connection layer 150 is filled between the first and second sidewalls 110, 120 in a direction D3, the arc surface 160 can allow the connection layer 150 to smoothly flow into a location between the first and second sidewalls 110, 120, and the connection layer 150 does not easily overflow.

Figure 8:
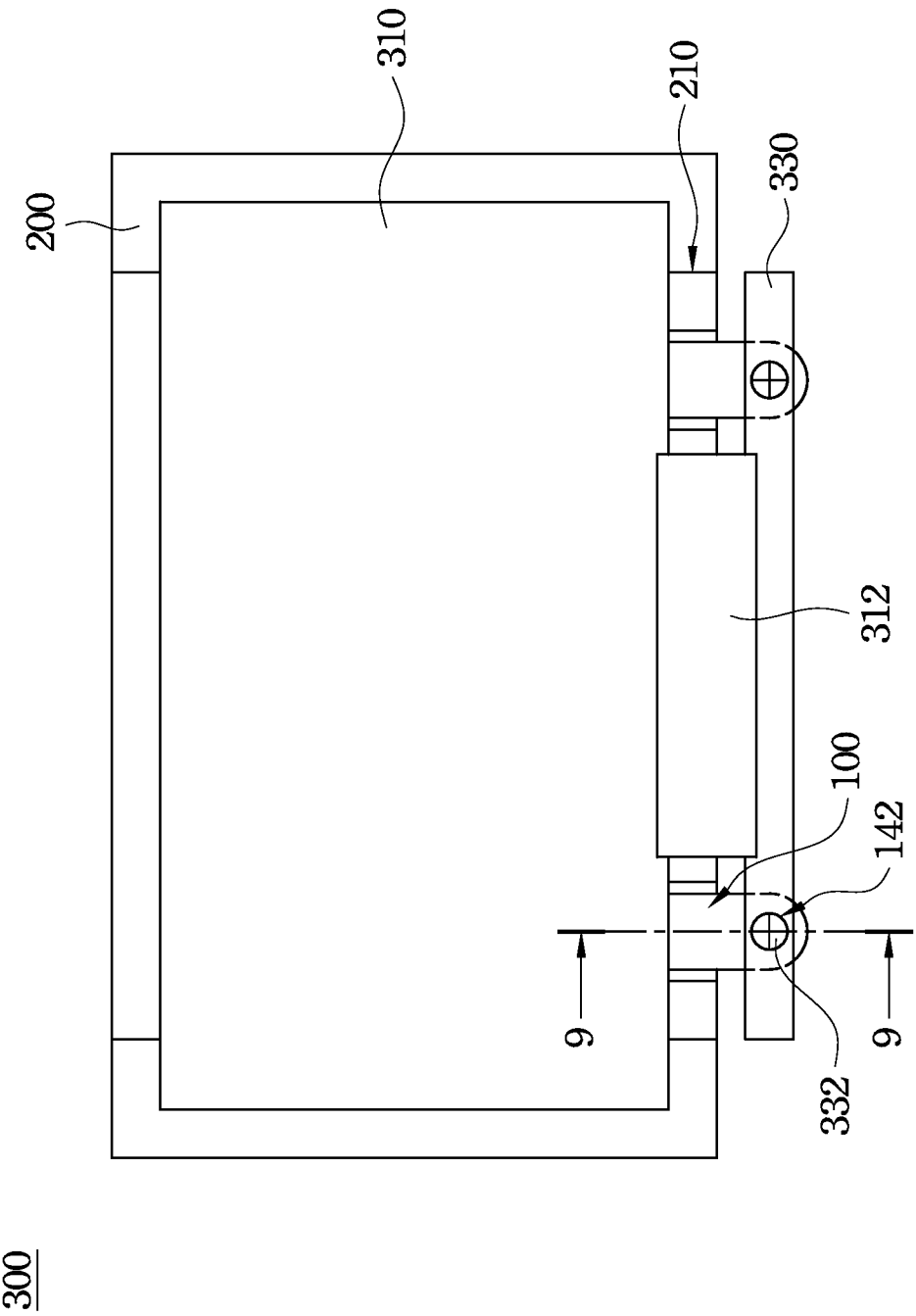
FIG. 8 is a top view of the frame body shown in FIG. 6 assembled to a display module.
Figure 9:
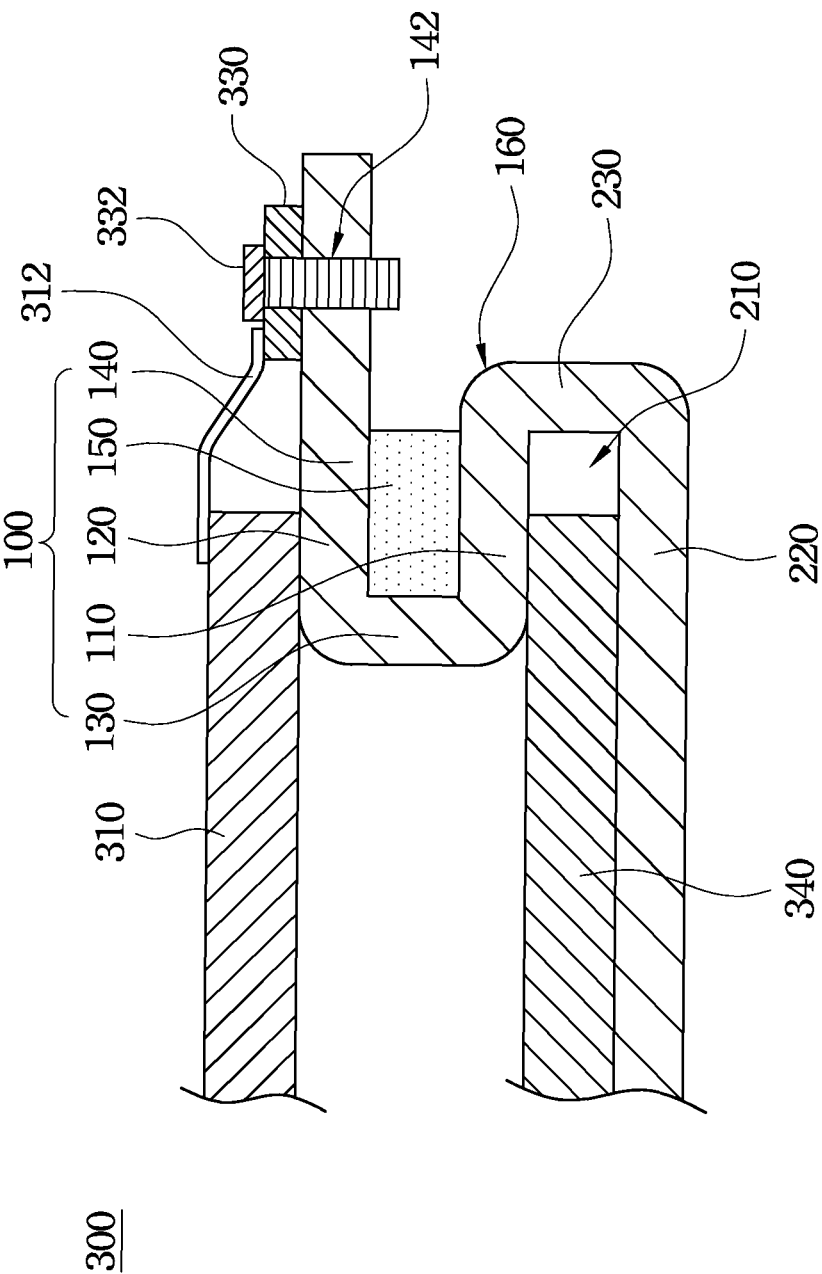
FIG. 9 is a cross-sectional view taken along line 9-9 shown in FIG. 8.

FIG. 8 is a top view of the frame body 200 shown in FIG. 6 assembled to a display module 300. FIG. 9 is a cross-sectional view taken along line 9-9 shown in FIG. 8. As shown in FIG. 8 and FIG. 9, the display module 300 includes the display panel 310, a printed circuit board 330, a printed circuit board screw 332, and a light guide plate 340. The display panel 310 is placed on a portion of the second sidewall 120 of the bracket 100. That is to say, an edge of the display panel 310 is supported by the second sidewall 120 of the bracket 100. In this embodiment, the light guide plate 340 is positioned in the accommodating space 210.

The display panel 310 is electrically connected to the printed circuit board 330 by a flexible printed circuit board 312. The printed circuit board 330 is located on the positioning board 140 of the bracket 100, and the printed circuit board screw 332 penetrates the printed circuit board 330 and is fixed in the through hole 142 of the positioning board 140. As a result, the printed circuit board 330 can be fixed on the frame body 200 by the bracket 100. In this embodiment, the through hole 142 is a hole having a thread capable of engaging the printed circuit board screw 332, but the present invention is not limited in this regard. The printed circuit board screw 332 may be replaced by a bolt, and it is necessary only that an element that can be fixed in the through hole 142 of the positioning board 140 be used.

Compared with a conventional bracket, the bracket of the present invention includes the connection layer to adhere the first and second sidewalls, such that the strength of the bracket can be increased. As a result, the bracket is not easily broken when external forces are applied to the bracket. Furthermore, since the connection layer can improve the strength of the bracket, materials with specific physical properties may be chosen for use in manufacturing the bracket, such as a material that is light, low cost, and that has good heat dissipation efficiency. Moreover, the portion of the bracket where the second sidewall and the positioning board are connected can be designed as an arc surface, such that the connection layer can flow into a location between the first and second sidewalls by gravity or through use of capillary action.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A bracket connected to a bottom plate, comprising:
a first sidewall having a first surface;
a second sidewall having a second surface that faces the first surface of the first sidewall;
a bending portion connected to the first and second sidewalls, wherein the bottom plate is connected to an end of the first sidewall that is distal to the bending portion;
a positioning board connected to an end of the second sidewall that is distal to the bending portion, wherein the first and second sidewalls, and the bending portion are made of the same material and formed as a single piece, and the positioning board and the bottom plate respectively extend in two opposite directions; and a connection layer directly adhering the first surface of the first sidewall to the second surface of the second sidewall.

2. The bracket as claimed in claim 1, wherein at least one gap is located between the first surface of the first sidewall and the second surface of the second sidewall.

3. The bracket as claimed in claim 1, wherein the first and second sidewalls are made of aluminum, and the connection layer is two-component epoxy adhesive capable of being cured at a room temperature, epoxy glue, or ultraviolet curing glue.

4. The bracket as claimed in claim 1, wherein the connection layer is solder.

5. The bracket as claimed in claim 1, wherein a portion of the bracket where the second sidewall and the positioning board are connected is formed as an arc surface.

6. The bracket as claimed in claim 1, wherein the first and second sidewalls are flat.

7. The bracket as claimed in claim 1, wherein the positioning board has a through hole, and a cover screw penetrates the through hole to fix the positioning board.

8. The bracket as claimed in claim 1, wherein the bottom plate and the positioning board are non-coplanar.

* * * * *